United States Patent [19]

Hamasaki

[11] Patent Number: 5,187,583
[45] Date of Patent: Feb. 16, 1993

[54] SOLID STATE IMAGER WHICH REDUCES THE NOISE AND IMPROVES THE SENSITIVITY

[75] Inventor: Masaharu Hamasaki, Kanagawa, Japan

[73] Assignee: Sony Corporation, Tokyo, Japan

[21] Appl. No.: 776,212

[22] Filed: Oct. 15, 1991

[30] Foreign Application Priority Data

Oct. 17, 1990 [JP] Japan .................. 2-279930

[51] Int. Cl.⁵ .......................... H04N 5/335
[52] U.S. Cl. .................. 358/213.15; 358/213.11; 358/213.29
[58] Field of Search ........... 358/213.15, 213.16, 358/213.17, 213.18, 209; 357/24 LR, 213.26, 213.27, 213.28

[56] References Cited

U.S. PATENT DOCUMENTS

| | | | |
|---|---|---|---|
| 4,809,075 | 2/1989 | Akimoto et al. | 358/213.18 |
| 4,810,896 | 3/1989 | Tanaka et al. | 250/578 |
| 4,914,519 | 4/1990 | Hashimoto et al. | 358/213.18 |
| 4,942,474 | 7/1990 | Akimoto et al. | 358/213.11 |
| 5,005,063 | 4/1991 | Janesick | 357/24 |

FOREIGN PATENT DOCUMENTS 0392754 10/1990 European Pat. Off. .
1-154678 6/1989 Japan .
1-243675 9/1989 Japan .

OTHER PUBLICATIONS

Japanese Patent Abstracts, vol. 12, No. 308 E647, Aug. 22, 1988 Publication No. JP63076367.

Primary Examiner—Herbert Goldstein
Assistant Examiner—Tuan V. Ho
Attorney, Agent, or Firm—Hill, Van Santen, Steadman & Simpson

[57] ABSTRACT

A solid state imager of an amplifying type having an amplifying element for each photo receptor portion, wherein a noise cancelling unit is provided for the amplified output of each photo receptor portion at every vertical line so as to decrease noises, and further the solid state imager is configured to be the rear-illuminated structure, so that the sensitivity of the solid state imager can be improved due to the reduction of the noises and the numerical aperture thereof can be also improved. The solid state imager comprises photo receptor portions each provided for each of a plurality of pixels arranged in a matrix configuration in the horizontal and vertical directions and each having an amplifying element provided on a major surface side of a substrate for amplifying a signal charge accumulated depending on the quantity of light incident thereon, the incident light being radiated on a rear surface side of the substrate, a noise cancelling unit provided for each vertical line for cancelling noise included in the output, first and second signal holding units for holding during a horizontal blanking period amplified outputs of the photo receptor portions of two pixels adjacent to each other in the vertical direction passed through the noise cancelling unit, and a signal reading unit for independently reading outputs of the first and second signal holding units.

2 Claims, 3 Drawing Sheets

FIG. 4
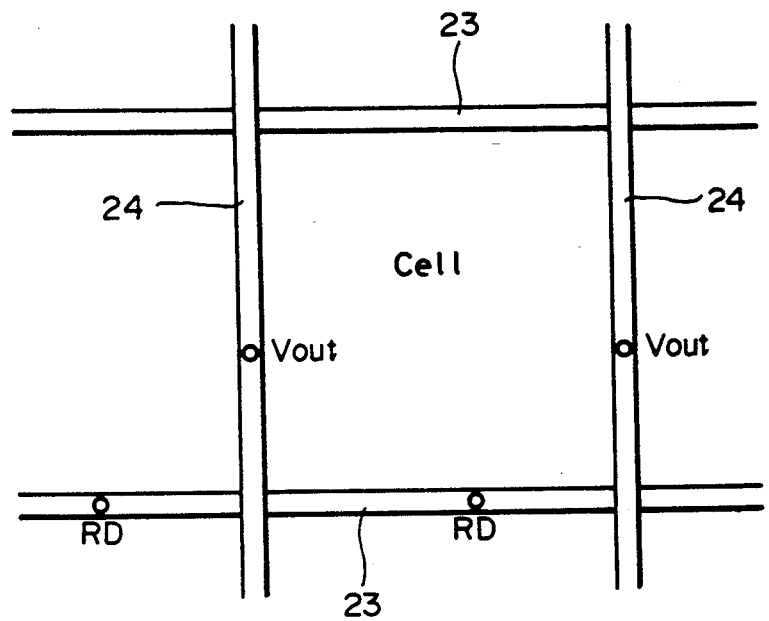
FIG. 5A  φRD
FIG. 5B  φRG
FIG. 5C  φC1
FIG. 5D  φSH
FIG. 5E  φOG
t1 t2   t3 t4 t5   t6   t7   Time

SOLID STATE IMAGER WHICH REDUCES THE NOISE AND IMPROVES THE SENSITIVITY

BACKGROUND OF THE INVENTION

1. Field of the Invention

The present invention relates generally to a solid state imager and more particularly to a solid state imager of an amplifying type having an amplifying element at every photo receptor portion.

2. Description of the Prior Art

In a typical conventional solid state imager using a charge coupled device (CCD), a signal charge whose amount depends on incident light quantities stored in a photoelectric converting portion of each pixel is directly transferred to an output portion by means of the CCD, so that there has been such a drawback that the signal-to-noise (S/N) ratio of the signal change is likely to be degraded since noise components are contaminated into the signal charge during the transferring thereof by the CCD.

In order to obviate this drawback of the conventional solid state imager, there has been proposed a solid state imager of an amplifying type wherein there are provided a photo receptor portion having a photoelectric converting portion for storing a signal charge whose amount depends on incident light quantities, a unit for amplifying the signal charge accumulated in the photoelectric converting portion, and a unit for resetting an input of the amplifying unit is provided for each of a plurality of pixels arranged in a matrix or two-dimensional configuration, as disclosed in, for example, Japanese Patent Laid-Open Publication No. 1-154678.

However, in this conventional amplifying type solid state imager, the fixed pattern noise due to defects of elements can be reduced by improving the manufacturing process of the imager, but the reset noise due to the characteristics etc. of the elements is hardly reduced since it is originated from the principle of the elements. Further, the conventional amplifying type solid state imager is of the front-illuminated structure, and so the numerical aperture is disadvantageously small.

OBJECTS AND SUMMARY OF THE INVENTION

Accordingly, it is a general object of the present invention to provide an improved solid state imager in which the aforementioned shortcomings and disadvantages of the prior art can be eliminated.

More specifically, it is an object of the present invention to provide an improved solid state imager which is capable of reducing noises and improving the numerical aperture to provide a high sensitivity.

According to an aspect of the present invention, a solid state imager is comprised of a plurality of pixels arranged in the horizontal and vertical directions in a matrix or two-dimensional configuration and each having an amplifying element, the output of which is connected to the corresponding vertical signal line; a plurality of noise cancel circuits, each being connected to the corresponding vertical signal line; a first hold unit for receiving the output signal of the n'th horizontal line during a horizontal blanking period through the noise cancel circuit; a second holding unit for receiving the output signal of the (n+1)'th horizontal line during a horizontal blanking period through the noise cancel circuit; and a switching unit for selectively supplying the output signal of the noise cancel circuit to the first hold unit or to the second hold unit.

According to another aspect of the present invention, a solid state imager is comprised of photo receptor portions each provided for the corresponding one of a plurality of pixels arranged in a matrix configuration to the horizontal and vertical directions and each having an amplifying element provided on a major surface side of a substrate for amplifying a signal charge accumulated depending on incident light quantities incident thereon, incident light being radiated on a rear surface side of the substrate; a plurality of noise cancelling units each provided for the corresponding vertical line for cancelling noise included in the outputs of the corresponding amplifying elements; first and second signal holding units for holding during a horizontal blanking period amplified outputs of the photo receptor portions of two pixels adjacent to each other to the vertical direction passed through the noise cancelling unit; and a signal reading unit for independently reading outputs of the first and second signal holding units.

According to the solid state imager of the present invention, noises included in the amplified outputs of the respective photo receptor portions are eliminated by the noise cancel units each provided for the corresponding vertical line, and the amplified outputs of the respective photo receptor portions of the two pixels adjacent to each other to the vertical direction are held during a horizontal scanning period, and then the held amplified outputs are independently read out, whereby a non-interlace television signal can be obtained.

Further, according to the present invention, a noise cancelling unit is provided for the amplified outputs of the respective photo receptor portions of each vertical line so as to decrease noises such as the reset noise and the smear, and further the solid state imager is configured to be the rear-illuminated structure, so that the sensitivity of the solid state imager can be improved due to the reduction of the noises and the numerical aperture thereof can be also improved.

The above and other objects, features and advantages of the present invention will become apparent from the following detailed description of an illustrative embodiment thereof to be read in conjunction with the accompanying drawings.

BRIEF DESCRIPTION OF THE DRAWINGS

FIG. 4 is a rear view illustrating a part of the solid state imager according to the embodiment of the present invention; and FIGS. 5A to 5E are a timing chart for explaining the operation of the circuit of FIG. 1.

DESCRIPTION OF THE PREFERRED EMBODIMENT

Figure 1:
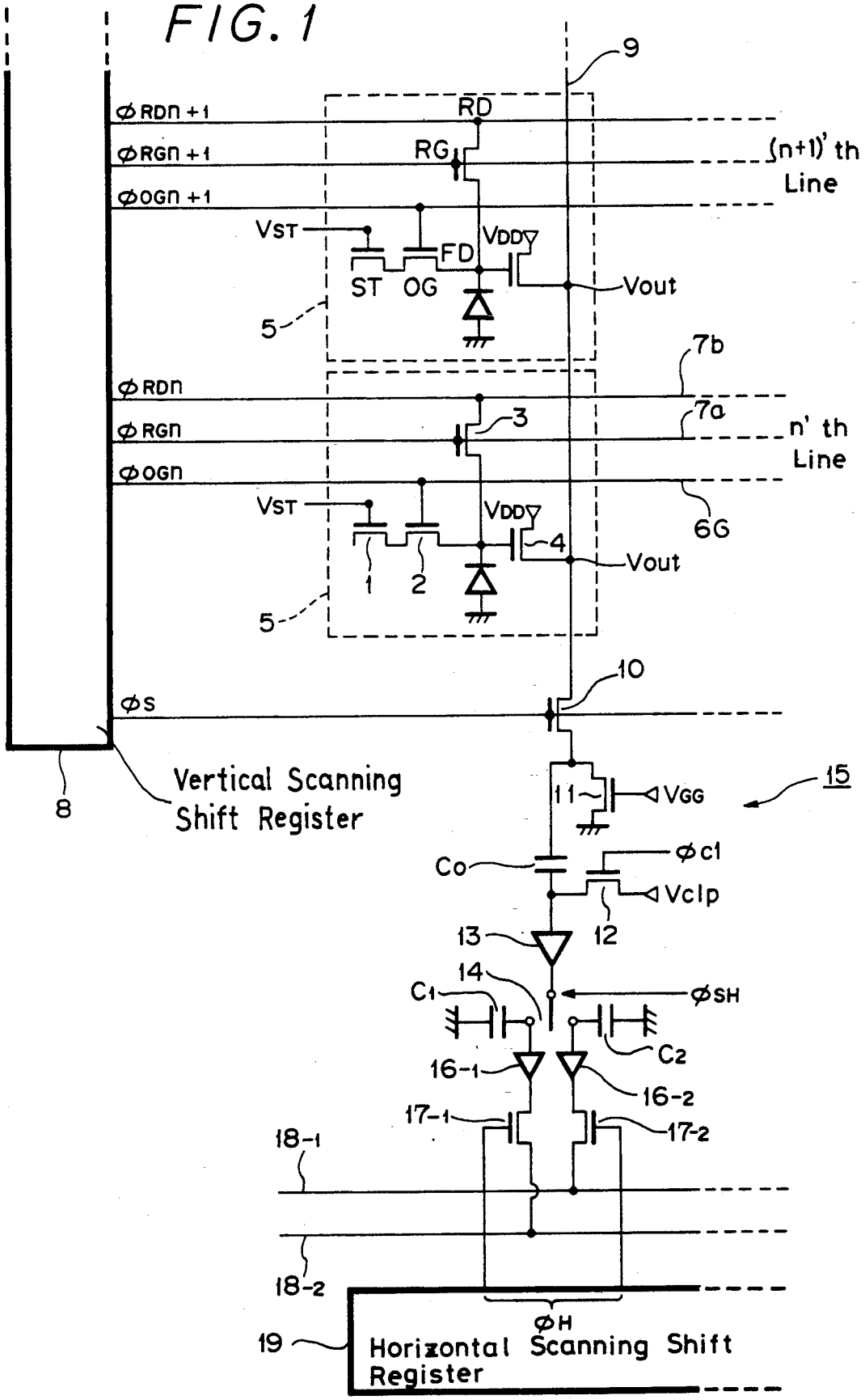
FIG. 1 is a circuit diagram illustrating a main part of a solid state imager according to an embodiment of the present invention.

A preferred embodiment of the present invention will now be described with reference to the accompanying drawings in which like reference numerals denote like or corresponding elements throughout the drawings.

FIG. 1 is a circuit diagram illustrating a main part of a solid state imager according to an embodiment of the present invention, wherein, among a plurality of pixels arranged in a matrix configuration in the horizontal and vertical directions, the circuit configuration of one pixel of each of only adjacent two lines, that is, n'th and (n+1)'th lines is shown for the simplification of the explanation since other pixels have the same circuit configurations.

Referring to FIG. 1, when light is incident on each pixel, a signal charge whose amount depends on an incident light quantity is stored in a storage (ST) 1. The storage 1 and an output gate (OG) switch 2 connected thereto constitutes a one-bit charge coupled device (CCD). A metal oxide semiconductor field effect transistor (MOSFET) 3 for a reset operation and a source follower MOSFET 4 for an amplifying operation are formed on the same chip as the CCD, and a gate of the MOSFET 4 for the amplifying operation is connected to a floating diffusion (FD) to constitute a floating diffusion amplifier (FDA) 5.

In the floating diffusion amplifier 5, a gate electrode of the output gate switch 2 is connected to an output gate (OG) signal line 6, a gate electrode of the MOSFET 3 for the reset operation is connected to a reset gate (RG) signal line 7a, and a drain electrode thereof is connected to a a reset drain (RD) signal line 7b. A horizontal line is selected by applying from a vertical scanning shift register 8 an output gate pulse $\phi_{OG}$, a reset gate pulse $\phi_{RG}$, and a reset drain pulse $\phi_{RD}$ to the gate electrode of the output gate switch 2, the gate electrode of the MOSFET 3 for the reset operation, and the drain electrode thereof, respectively. A drain electrode of the MOSFET 4 for the amplifying operation is supplied with a power supply voltage $V_{DD}$ and a source electrode thereof serving as an output terminal Vout is connected to a vertical signal line 9. In this configuration, when one horizontal line is selected, the signal charge of the pixel of the selected horizontal line is amplified by the MOSFET 4 for the amplifying operation to be applied to the vertical signal line 9.

A load transistor 11 is connected to the vertical signal line 9 through a transfer gate switch 10, so that the amplified signal charge of each pixel applied to the vertical signal line 9 is stored in a noise cancelling capacitor $C_0$ through the transfer gate switch. An output terminal of the capacitor $C_0$ is connected to a clamping switch 12, which is turned on in response to a clamping pulse $\phi cl$ applied to a gate electrode thereof to thereby clamp a voltage of the output terminal of the capacitor $C_0$ at a clamping level Vclp. The noise cancelling capacitor $C_0$ and the clamping switch 12 constitute a correlated double sampling (CDS) circuit 15 for decreasing reset noise etc. included in the source output signal of the MOSFET 4.

The output signal of the noise cancelling capacitor $C_0$ is applied through a buffer amplifier 13 to a change-over switch 14, which in turn selectively applies the output signal to first and second signal holding units, e.g., sample-and-hold capacitors C1 and C2 to thereby sample and hold the output signal. The change-over switch 14 is controlled by a sample-and-hold pulse $\phi_{SH}$ generated in a horizontal blanking period such that it is alternately connected to the capacitors C1 and C2 at every one line. Thus, an output signal of a pixel on an even number line and that on an odd number line are held in these sample-and-hold capacitors, for example, capacitors C1 and C2, respectively.

The signals held in the capacitors C1 and C2 are applied through buffer amplifiers $16_{-1}$ and $16_{-2}$ to horizontal gate switches $17_{31\ 1}$ and $17_{31\ 2}$, which in turn apply the signals to horizontal signal lines $18_{-1}$ and $18_{-2}$ by the switching operations thereof responding to horizontal shift pulses $\phi_H$ applied thereto from a horizontal scanning shift register 19, respectively.

Figure 2:
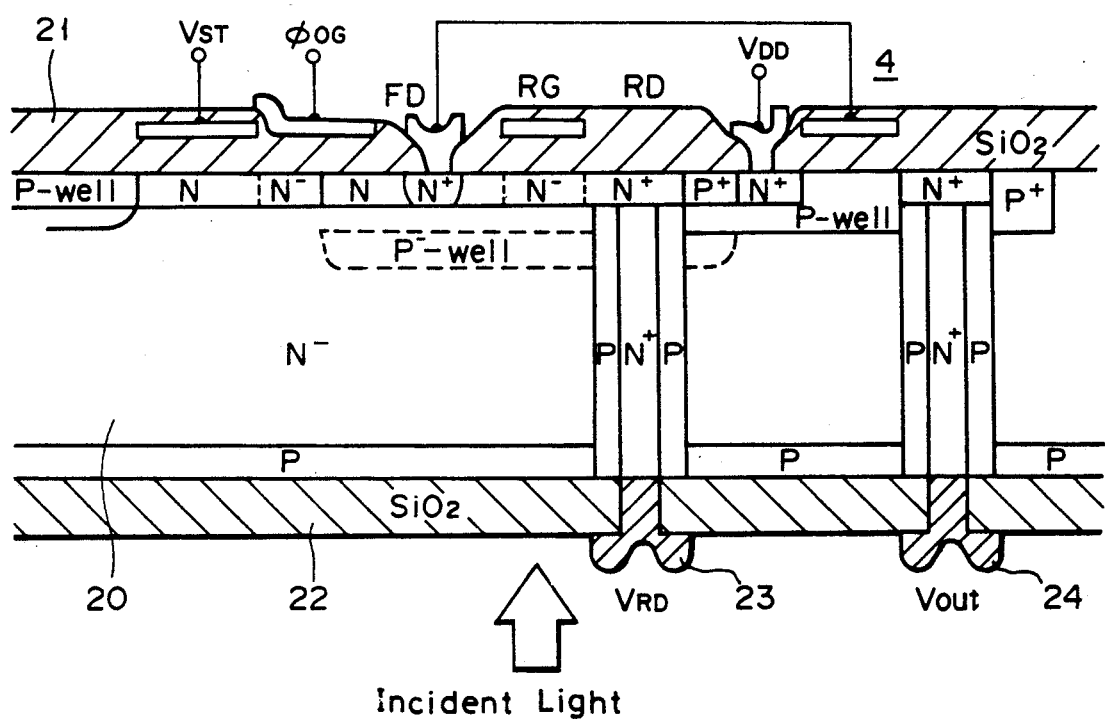
FIG. 2 is a sectional view illustrating the structure of one unit cell.

FIG. 2 shows a cross-sectional view of the thus constituted solid state imager of the present invention, that is, a cross-sectional sectional view of the storage (ST), output gate (OG), reset gate (RG), reset drain (RD), and drain electrode ($V_{DD}$), gate electrode and source electrode (Vout) of the FET 4 in one unit cell (one-bit CCD). The FET 4 may be a junction FET instead of the MOSFET shown in FIG. 2. As clear from FIG. 2, the solid state imager according to the present invention is constituted in a manner as described below. Firstly, electrode element groups constituting the floating diffusion amplifier (FDA) are arranged on a major surface of a thin silicon substrate 20, and then an $SiO_2$ film 21 is deposited thereon by the chemical vapor deposition (CVD) process, etc. An $SiO_2$ film 22 is provided on a rear surface of the silicon substrate 20, then horizontal aluminum lines 23 and vertical aluminum lines 24 are interconnected in a matrix pattern configuration on the $SiO_2$ film 22 as shown in FIG. 4 to thereby connect the reset drain (RD) and the output terminal (Vout) of the amplifying MOSFET 4 to the lines 23 and 24, respectively. Thus, the solid state imager is constituted such that incident light is radiated on the rear surface side of the silicon substrate 20, that is, a rear-illuminated structure.

Thus, since the solid state imager is constructed to be the rear-illumination type, only the horizontal and vertical aluminum lines 23 and 24 are interconnected on the rear surface side of the silicon substrate 20, thereby improving a numerical aperture (NA) remarkably to provide a high sensitivity.

An operation of the one unit cell (one pixel) selected by the vertical scanning shift register 8 and the horizontal scanning shift register 19 in the solid state imager according to the present invention will be explained in accordance with a time chart in FIG. 5 with reference to the sectional diagram of the cell in FIG. 2 and a potential distribution diagram in FIG. 3.

Figure 3:
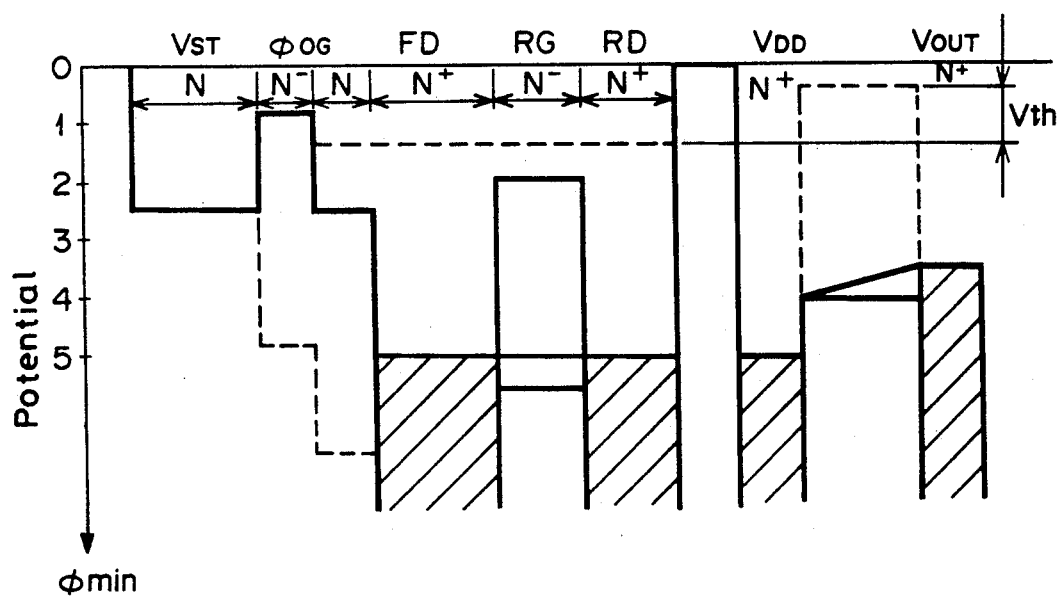
FIG. 3 is a diagram illustrating the potential distribution of the one unit cell of FIG. 2.

Firstly, in a horizontal blanking period, as shown in FIG. 3, a reset voltage $V_{RD}$ of a high level (e.g., 5 V) of the reset drain pulse $\phi_{RD}$ is applied at a time point t1 to the reset drain (RD) of only the n'th horizontal line to be selected in the vertical direction, while a low level voltage (e.g., 1.5 V) is applied to the reset drains of the remaining horizontal lines, whereby one horizontal line (the n'th line) is selected (refer to FIGS. 5A to 5E). At this time, the reset gate pulse $\phi_{RG}$ of a high level is applied to the floating diffusion FD of a pixel of the selected horizontal line to reset it, then the voltage of the floating diffusion FD becomes a high level to make the the gate electrode of the amplifying MOSFET 4 also a high level. On the other hand, the voltage of the floating diffusion FD of each pixel of the non-selected horizontal lines is kept at a low level, so that the voltage of the gate electrode of the amplifying MOSFET 4 is smaller than the voltage of the floating diffusion FD by a threshold level Vth (e.g., 0.5 V) as shown by a dotted line in FIG. 3 to place the MOSFET 4 in a cut-off state.

Then, the voltage of the reset gate pulse $\phi_{RG}$ is shifted to a low level at a time point t2 to place each of the MOSFETs 3 for the reset operation in a cut-off state. In this state, the clamping switch 12 is made in the ON state by the clamping pulse $\phi cl$ of a high level applied thereto to thereby clamp the output terminal of the capacitor $C_0$ at the clamping level Vclp. When the clamping pulse $\phi cl$ is shifted to a low level at a time point t3 or disappears, the clamping switch 12 is turned off.

The capacitor $C_0$ and the clamping switch 12 of the CDS circuit 15 can cancel a fixed pattern noise (FPN) due to defects of elements, fluctuation of the threshold level Vth due to variations of the offset input to the source follower MOSFET 4, low frequency (1/f) noise of the source follower, reset noise generated in resetting the FDA, and smear due to incident light on the signal lines and the CCDs, whereby a frame memory which has been used in a signal processing system in order to eliminate the fixed pattern noise of the prior art can be removed.

Thereafter, the output gate (OG) 2 is turned on in response to the output gate pulse $\phi_{OG}$ of a high level at a time point t4 to thereby start transferring the signal charge stored in the storage (ST)1 to the floating diffusion (FD) so that all signal charge stored in the storage is transferred to the FD until the output gate pulse $\phi_{OG}$ becomes low level or disappears at a time point t5. The change-over switch 14 is then changed over to the sample-and-hold capacitor C1 side in response to the sample-and-hold pulse $\phi_{SH}$ of a high level at a time point t6 to thereby apply the signal voltage to the capacitor C1, and then the change-over switch 14 is turned off to be positioned at a neutral position as shown in FIG. 1 when the sample-and-hold pulse $\phi_{SH}$ becomes a low level or disappears at a time point t7 to thereby hold the signal voltage in the capacitor C1.

Thus, according to the above-described operation sequence, the signal charge of the n'th horizontal line is amplified by the amplifying MOSFET 4 and stored in the capacitor C1 of the CDS circuit 15, and thereafter, according to the similar operation sequence, the signal charge of the (n+1)'th horizontal line is amplified by the amplifying MOSFET 4 corresponding to the (n+1)'th line and stored in the capacitor C2 of the CDS circuit 15. Accordingly, the signal charges of the two pixels adjacent to each other in the vertical direction can be read out independently during an effective or valid horizontal scanning period by controlling the horizontal gateswitches $17_{31\ 1}$ and $17_{-2}$ in response to the horizontal shift pulses $\phi_H$ applied from the horizontal scanning shift register 19. Now, in the effective horizontal scanning period, the reset gate (RG) is set at a high level and the reset drain (RD) is set at a low level (about 1.5 V).

In the reading operation, a non-interlace television signal can be obtained by reading out the signal held in the capacitors C1 and C2 alternately. Alternatively, the signals held in the capacitors C1 and C2 may be read out simultaneously and then may be suitably processed by a signal processing system (not shown) to thereby obtain a non-interlace television signal similar to the sequential reading.

When the signal charge stored in the storage (ST) 1 overflows, it is dumped through a lateral overflow train passing from the storage ST to the reset drain RD through the output gate OG and the floating diffusion FD shown in FIG. 2. Accordingly, since the reset drain electrode (RD) of the MOSFET 3 for the reset operation is used not only for selecting the horizontal line but also for the overflow drain, the circuit configuration for selecting the pixel of the horizontal line and that of the overflow train can be simplified.

As described above, according to the present invention, a noise cancelling unit is provided for the amplified outputs of the respective photo receptor portions of each vertical line so as to decrease noises such as the reset noise, the smear or the like, and further the solid state imager is configured to be the rear-illuminated structure, so that the sensitivity of the solid state imager can be improved due to the reduction of the noises and the numerical aperture thereof can be also improved.

Having described the preferred embodiment of the present invention with reference to the accompanying drawings, it is to be understood that the invention is not limited to the precise embodiment and that various changes and modifications thereof could be effected by one skilled in the art without departing from the spirit or scope of the novel concepts of the invention as defined in the appended claims.

What is claimed is:

1. A solid state imager comprising:
   (a) a plurality of pixels arranged in a matrix configuration and each having an amplifying element, the output of which is connected to a corresponding vertical signal line;
   (b) a vertical scanning shift register to sequentially select a horizontal line of said plurality of pixels;
   (c) a horizontal scanning shift register;
   (d) a plurality of noise cancel circuit, each being connected to the corresponding vertical signal line;
   (e) first sample and hold means for receiving the output signal of the nth horizontal line wherein n is equal to or greater than one during horizontal blanking period through said noise cancel circuit;
   (f) second sample and hold means for receiving the output signal of the (n+1)th horizontal line during horizontal blanking period through said noise cancel circuit;
   (g) switching means for selectively supplying the output signal of said noise cancel circuit to said first sample and hold means or to said second sample and hold means; and
   (h) a pair of horizontal gate switches connected between the output of said first and second sample and hold means and a pair of horizontal output signal lines, said horizontal gate switches being controlled by said horizontal scanning shift register so as to produce output signals independently at said pair of horizontal output signal lines wherein the output signals are used in further signal processing.

2. A solid state image according to claim 1 wherein said noise cancel circuits each comprising noise cancelling capacitor in a clamping switch.

* * * * *